US 10,241,322 B2

(12) United States Patent
Gritti et al.

(10) Patent No.: US 10,241,322 B2
(45) Date of Patent: Mar. 26, 2019

(54) DEVICE AND METHOD FOR QUASI-RESONANT-MODE VOLTAGE CONTROL OF A SWITCHING CONVERTER

(71) Applicant: STMICROELECTRONICS S.R.L., Agrate Brianza (IT)

(72) Inventors: Giovanni Gritti, Bergamo (IT); Claudio Adragna, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 117 days.

(21) Appl. No.: 15/383,844

(22) Filed: Dec. 19, 2016

(65) Prior Publication Data

US 2018/0004240 A1     Jan. 4, 2018

(30) Foreign Application Priority Data

Jun. 30, 2016   (IT) ................ 10201667918

(51) Int. Cl.
*H02M 3/335*    (2006.01)
*G02B 26/08*    (2006.01)
(Continued)

(52) U.S. Cl.
CPC ........ *G02B 26/0833* (2013.01); *B81B 3/0045* (2013.01); *G05F 3/26* (2013.01);
(Continued)

(58) Field of Classification Search
CPC ........ H02M 1/42; H02M 7/217; H02M 3/157; H02M 1/4208; H02M 1/4225
See application file for complete search history.

(56) References Cited

U.S. PATENT DOCUMENTS 5,367,247 A    11/1994  Blocher et al.
8,467,209 B2   6/2013   Adragna
(Continued)

FOREIGN PATENT DOCUMENTS

CN    205283422 U     6/2016
DE    102016102160 A1  8/2016

OTHER PUBLICATIONS

Fairchild Semiconductor Corporation, "FAN7930B Critical Conduction Mode PFC Controller," Datasheet, Nov. 2013, 23 pages.
(Continued)

*Primary Examiner* — Harry Behm
*Assistant Examiner* — Lorena Bruner
(74) *Attorney, Agent, or Firm* — Seed IP Law Group LLP

(57) ABSTRACT

A control device for controlling a switching converter includes a switch controller that generates a control signal with a switching period for controlling switching of a switch of the switching converter and setting a first interval in which a current flows in the switch, a second interval in which energy is transferred onto a storage element of the switching converter, and a third, wait, interval, at the end of the second interval. The duration of the first interval is determined based on a control voltage indicating the output voltage. A pre-distortion stage receives the control voltage and generates a pre-distorted control voltage as a function of the control voltage and a relationship between one of the first and third time intervals and the switching period, wherein the switch controller is configured to control a duration of the first interval based on the pre-distorted control voltage.

20 Claims, 8 Drawing Sheets

(51) Int. Cl.
   *H02M 1/12*   (2006.01)
   *H02M 1/15*   (2006.01)
   *B81B 3/00*   (2006.01)
   *H04N 9/31*   (2006.01)
   *G05F 3/26*   (2006.01)
   *H02M 1/42*   (2007.01)
   *H02M 1/00*   (2006.01)

(52) U.S. Cl.
   CPC .............. *H02M 1/12* (2013.01); *H02M 1/15* (2013.01); *H02M 1/42* (2013.01); *H02M 3/33507* (2013.01); *H04N 9/3155* (2013.01); *H04N 9/3173* (2013.01); *B81B 2201/042* (2013.01); *B81B 2203/0315* (2013.01); *B81B 2203/056* (2013.01); *H02M 1/4225* (2013.01); *H02M 1/4258* (2013.01); *H02M 2001/0025* (2013.01); *H02M 2001/0032* (2013.01); *Y02B 70/126* (2013.01); *Y02B 70/16* (2013.01)

(56) References Cited

U.S. PATENT DOCUMENTS

| | | |
|---|---|---|
| 8,867,237 B2 | 10/2014 | Desimone et al. |
| 9,083,250 B2 | 7/2015 | Adragna |
| 9,154,030 B2 | 10/2015 | Bianco et al. |
| 9,413,225 B2 | 8/2016 | Castelli et al. |
| 9,502,961 B2 | 11/2016 | Castelli |
| 9,621,029 B2 | 4/2017 | Gritti |
| 9,800,148 B2 | 10/2017 | Gritti et al. |
| 2013/0194845 A1* | 8/2013 | Bianco ................ H02M 1/4225 363/90 |
| 2014/0078798 A1* | 3/2014 | Turchi ................ H02M 1/4225 363/89 |
| 2015/0229204 A1 | 8/2015 | Mao et al. |
| 2016/0276924 A1 | 9/2016 | Castelli |

OTHER PUBLICATIONS

Unitrode Integrated Circuits, "High Power-Factor Preregulator," Application Information for UC1852, UC2852, and UC3852, Sep. 5, 1999, 10 pages.
Semiconductor Components Industries, LLC, "NCP1607 Cost Effective Power Factor Controller," NCP1607/D Rev. 2, Jul. 2015, 23 pages.
STMicroelectronics, "TM PFC with X-Cap Discharge and LLC Resonant Combo Controller," STCMB1 Rev. 2, Feb. 2016, 51 pages.
Datasheet for High Power-Factor Preregulator—UC1852, UC2852, UC3852, Unitrode—Integrated Circuits, 2008, 10 pgs.
Datasheet for Critical Conduction Mode PFC Controller—FAN7930B, Fairchild Semiconductor, 2010, 14 pgs.
Datasheet for Cost Effective Power Factor Controller—NCP1607, ON Semiconductor, Jul. 2015, 23 pgs.
Datasheet for TM PFC with X-cap discharge and LLC resonant combo controller—STCMB1, STMicroelectronics, Feb. 2016, 51 pgs.

* cited by examiner

DEVICE AND METHOD FOR QUASI-RESONANT-MODE VOLTAGE CONTROL OF A SWITCHING CONVERTER

BACKGROUND

Technical Field

The present disclosure relates to a device and a method for quasi-resonant-mode voltage control of a switching converter, in particular (but without this implying any loss of generality) a power-factor-correction converter (in what follows referred to as PFC converter).

Description of the Related Art

As it is known, voltage converters used in switched-mode power supplies (SMPSs) or in solid-state lighting (SSL) systems are used to satisfy stringent specifications as regards the corresponding electrical performance. In particular, converters are used to guarantee a high quality factor (with a substantially unit power factor—PF, for example higher than 0.9), and a high efficiency/low power consumption in conditions of absence of load (for example, with a dissipated power of less than 300 mW).

In general, these power converters are designed to convert a quantity received at the input, for example an AC voltage coming from the electrical mains supply, into a regulated output quantity, for example a DC voltage, to supply an electrical load, for example, a group of LEDs.

The high power factor, for example, satisfies the limitations to harmonic current emission envisaged by the standards (for example, by the IEC 61000-3-2 standard in Europe, and the JEITA-MITI standard in Japan); whereas high efficiency/low power consumption meet the energy-efficiency specifications, for example ENERGY STAR 2.0 for external power supplies or ENERGY STAR 5.0 for computers and the like.

In particular, when a high output power is desired (for example, higher than 50-75 W), it is known to use power converters having a two-stage architecture, where a first stage typically defines a PFC converter, for example of a voltage-boost type. The PFC converter in this case carries out an operation of boosting of the AC mains voltage, generating at output a regulated DC voltage, for example having the value of 400 V. The PFC converter is controlled by an appropriate control device for regulating the power factor in the absorption from the electric power mains.

By way of example, FIG. 1 shows the electrical diagram of a power converter, for example a PFC converter of a voltage-boost type, designated as a whole by 1, controlled by a corresponding control device, designated by 2 (it is underlined, however, that what follows may apply to different converter topologies, for example of a flyback or buck-boost type).

The control device 2 is made as an integrated circuit, and has a package and corresponding input and output pins. The integrated circuit may be mounted on a same printed circuit board (PCB) with the circuit components that define the power converter 1.

In particular, the power converter 1 has, in this configuration: an input terminal IN, on which an input voltage $V_{in}$ (rectified sinusoid) is present, generated by a rectifier stage 3 (illustrated schematically) starting from an AC mains voltage $V_{AC}$, for example supplied by the electrical mains supply; and an output terminal OUT, on which an output voltage $V_{out}$ is present, for example a DC voltage, of a value higher than the input voltage $V_{IN}$, which is regulated at a desired value (for example, 400 V).

A filter capacitor 4a, having high-frequency filtering functions, is connected to the input terminal IN, whereas a storage capacitor 4b, having charge-storage functions, is connected to the output terminal OUT. Both filter capacitor 4a and storage capacitor 4b are further connected to a reference, or ground, terminal (GND).

The power converter 1 comprises: an inductor 5, connected between the input terminal IN and a first internal node $N_1$; a switch element 6, in particular a power MOSFET, connected between the first internal node $N_1$ and the reference terminal; and a diode element 7, having its anode connected to the first internal node $N_1$ and its cathode connected to the output terminal OUT.

The switch element 6 has a first current-conduction terminal, in particular the drain terminal of the respective MOSFET, connected to the first internal node $N_1$, a second current-conduction terminal, in particular the source terminal of the respective MOSFET, connected to the reference terminal, and a control terminal, coinciding with the gate terminal of the respective MOSFET.

A voltage divider 8 is connected between the output terminal OUT and the reference terminal and is formed by a first voltage-divider resistor 8a, connected in series to a second voltage-divider resistor 8b, defining an internal node $N_2$ from which a feedback voltage V is taken.

The power converter 1 further comprises an auxiliary winding 9, magnetically coupled to the inductor 5 and on which a monitoring voltage $V_{ZCD}$ is present.

The control device 2 has: a first input terminal 2a, connected to the second internal node $N_2$ and designed to receive the feedback voltage $V_{FB}$; a second input terminal 2b, connected to the auxiliary winding 9 by a first coupling resistor 10 and designed to receive the monitoring voltage $V_{ZCD}$, being a function of the voltage across the auxiliary winding 9; and an output terminal 2c, connected to the control terminal of the switch element 6 by a second coupling resistor 11 and designed to supply a control signal GD for controlling switching of the same switch element 6 in pulse-width modulation (PWM), with a suitable timing.

The control device 2 has further terminals 2d, 2e connected to a supply voltage $V_{CC}$ and to the reference terminal, respectively.

In particular, the control device 2 may be configured to control operation of the power converter 1 in so-called quasi-resonant mode, also defined as "transition mode", "critical mode", or "borderline mode".

At each switching cycle, the control device 2 controls closing of the switch element 6 for an interval $T_{ON}$ ('ON' interval of the duty cycle), during which the current coming from the power supply circulates in the inductor 5 and in the switch element 6 towards ground, determining a storage of energy in the same inductor 5.

In voltage-control mode, the duration of the on interval $T_{ON}$ is set by the control device 2 by an appropriate feedback control loop based on a value indicative the output voltage $V_{out}$, in this case obtained from the feedback voltage $V_{FB}$, which is compared with an appropriate reference voltage (as described in detail hereinafter).

In a way not illustrated herein, the control loop may alternatively be based on a peak-current control.

The control device 2 then controls opening of the switch element 6 for an interval $T_{OFF}$ ('OFF' interval of the duty cycle), during which the energy previously stored in the inductor 5 is transferred to the load, and the charge-storage element 4b, via the diode element 7.

In particular, upon completion of energy transfer, the current in the inductor 5 is zero. A resonance condition around the value of the input voltage $V_{in}$ occurs on the voltage at the first internal node $N_1$, on account of the capacitance present on the same first internal node $N_1$, mainly due to the parasitic capacitance of the drain terminal of the MOSFET of the switch element 6 and to the parasitic capacitance of the diode element 7 (being off).

According to the quasi-resonant control mode, the switch element 6 is closed (and the corresponding MOSFET is switched on) at the minimum of the resonant oscillation present on the drain voltage of the corresponding MOSFET, with a certain delay with respect to the instant of zeroing of the current in the inductor 5, so that the converter operates in a condition of switching at zero current and voltage, enabling a high efficiency and minimal on-losses. This control is also referred to as "valley-switching", in so far as closing of the switch element 6 occurs at the valley of the oscillation of the MOSFET drain voltage.

Detection of the valley condition, and thus determination of the duration of the off interval $T_{OFF}$, is made by the control device 2 on the basis of the monitoring voltage $V_{ZCD}$, which in turn is a function of the voltage across the auxiliary winding 9.

FIG. 2 shows the plots, corresponding to the control mode illustrated, of the current $I_L$ in the inductor 5 and of the control signal GD (with the on interval $T_{ON}$, during which energy is stored in the inductor 5, and the off interval $T_{OFF}$ being shown). Further shown are a so-called free-wheeling time interval $T_{FW}$, in which the inductor current $I_L$ circulates through the diode element 7 (transferring energy onto the storage element 4b), and a delay time interval $T_R$, which corresponds to the waiting interval for valley switching, i.e., the interval between the instant when the inductor current $I_L$ goes to zero and the instant when the switch element 6 is closed again.

With reference to FIG. 3, a more detailed description of an embodiment, of a known type, of the control device 2, which implements the control method discussed previously, is now presented. This control device 2 corresponds, for example, to the device coded STCMB1, produced and marketed by the present Applicant.

The control device 2 comprises an error-amplifier stage 12, having an inverting input terminal, which is connected to the first input terminal 2a and receives the feedback voltage $V_{FB}$, and a non-inverting input terminal, which receives a reference voltage $V_{REF}$, of an appropriate value (for example, generated within the control device 2 by a band-gap generator starting from the supply voltage $V_{CC}$); the error-amplifier stage 12 generates, as a function of the difference between the feedback voltage $V_{FB}$ and the reference voltage $V_{REF}$, a control voltage $V_C$, indicative of the value of the output voltage $V_{out}$ of the power converter 1.

In a way not described in detail, a compensation network, of an RC type, is coupled to the output of the error-amplifier stage 12, designed to define the DC gain of the error-amplifier stage 12 and the corresponding operating frequency bandwidth, ensuring stability of the control loop.

The control device 2 further comprises a comparator stage 15, having a first comparison terminal, which is coupled to the output of the error-amplifier stage 12, and receives the control voltage $V_C$, a second comparison terminal, which receives a ramp voltage $V_R$, and an output, which generates a comparison signal $S_C$.

In particular, the ramp voltage $V_R$ is generated by charging of a capacitor 16, having capacitance C, with an appropriate, constant, charging current $I_C$ generated by a current generator 17. A switch 18, controlled by a control signal SW, is further connected in parallel to the capacitor element 16, to determine start of charging and subsequent discharging thereof (and thus the alternately ascending and descending pattern of the ramp voltage $V_R$).

The control device 2 further comprises an S/R flip-flop 19, having: a reset input R, which is connected to the output of the comparator stage 15 and receives the comparison signal $S_C$; a set input S connected to a timing stage 20; a negated output Q, which defines the aforesaid control signal SW of the switch 18; and an output Q, which supplies, via a driver unit 21, the control signal GD for controlling switching of the switch element 6 of the power converter 1.

The timing stage 20 comprises a detection unit 26, which is coupled to the second input 2b of the control device 2 and receives the monitoring voltage $V_{ZCD}$. The detection unit 26 generates a detection signal ZCD indicating onset of the zero-current condition in the inductor 5.

The timing stage 20 further comprises: a delay unit 22, which is connected to the output of the detection unit 26 and is configured to apply an appropriate time delay to the detection signal ZCD; an OR logic gate 24, having a first input connected to the output of the delay unit 22, a second input connected to a starter unit 25, and an output, which supplies the set signal S to the S/R flip-flop 19.

During operation, considering the bandwidth of the error-amplifier stage 12 being sufficiently narrow, for example less than 20 Hz, the control voltage $V_C$ may be considered substantially constant (i.e., a DC value) over a mains cycle.

The peak value $V_{R\_pk}$ of the ramp voltage $V_R$ may be expressed as:

$$V_{R\_pk} = \frac{I_C}{C} T_{ON} \tag{1}$$

Assuming that the switch element 6 is initially on, the ramp voltage $V_R$ increases until it reaches the value of the control voltage $V_C$, thus switching the output of the comparator stage 15, which resets the S/R flip-flop 19 and causes opening of the same switch element 6.

Consequently, the output of the comparator stage 15 determines the duration of the on interval $T_{ON}$ of the switch element 6, according to the expression:

$$T_{ON} = \frac{C}{I_C} V_C \tag{2}$$

which has been obtained starting from the aforesaid Eq. (1) by setting: $V_{R\_pk} = V_C$.

It should be noted that, on the aforesaid hypothesis of the control voltage $V_C$ being constant, also the duration of the on interval $T_{ON}$ is substantially constant during each mains period.

After opening of the switch element 6, the inductor 5 transfers the energy accumulated onto the storage capacitor 4b and to the load, until it is completely demagnetized. At that point, the diode element 7 stops conducting, and the voltage on the first internal node $N_1$, and thus the drain voltage of the MOSFET, is floating.

This voltage would tend to reach the instantaneous mains voltage via the oscillation due to the resonant coupling between the corresponding parasitic capacitance and the inductance of the inductor 5.

However, the sudden drop in voltage that occurs on the aforesaid first internal node $N_1$ following upon demagnetization of the inductor 5 is detected by the detection unit 26 of the timing stage 20, which generates a pulse, upon detection of a falling edge of the monitoring voltage $V_{ZCD}$.

This pulse in the detection signal ZCD, appropriately delayed by the delay unit 22 as a function of the delay time interval $T_R$, thus sets the S/R flip-flop 19 and closes the switch element 6 again, thus determining a new operating cycle of the power converter 1.

In this way, the control method envisages that start of each new switching cycle occurs after the current in the inductor 5 has reached a zero level, after an appropriate delay.

It should be noted that the presence of the OR logic gate 24 in the timing stage 20 enables start of a new operating cycle, for example, in the start-up phase (or upon return from a deactivation condition), when the monitoring voltage $V_{ZCD}$ at the second input 2b of the control device 2 is not yet present. This feature further enables the power converter 1 not to stop in the case where, for any reason, the same monitoring voltage $V_{ZCD}$ is not present on the second input 2b.

In greater detail, and with reference also to the diagrams of FIG. 4 (which shows the main electrical quantities in the control device 2), the input voltage $V_{IN}$ may be considered substantially a rectified sinusoid, i.e., $V_{IN}(\theta)=V_{IN,pk}|\sin\theta|$, where $\theta \in (0, \pi)$.

The peak value $I_{L\_pk}$ of the inductor current $I_L$ is thus given by:

$$I_{L\_pk}(\theta) = \frac{V_{IN}(\theta) T_{ON}}{L} \qquad (3)$$

Substituting Eq. (2):

$$I_{L\_pk}(\theta) = \frac{V_{IN}(\theta)}{L} \frac{C}{I_C} V_C \qquad (4)$$

As may be noted from the diagrams of FIG. 2, the switching period $T(\theta)$ of the power converter 1 may be expressed as:

$$T(\theta) = T_{ON} + T_{FW}(\theta) + T_R \qquad (5)$$

where the sum $T_{FW}(\theta) + T_R$ constitutes the off interval $T_{OFF}$.

Furthermore, the input current $I_{IN}$ of the power converter 1 may be determined by averaging the inductor current $I_L(t,\theta)$ over one switching cycle. Once again with reference to FIG. 2, it may be immediately verified that the following equation applies:

$$I_{IN}(\theta) = \frac{1}{2} I_{L\_pk}(\theta) \frac{T_{ON} + T_{FW}(\theta)}{T(\theta)} \qquad (6)$$

Substituting in Eq. (6) the previous Eqs. (4) and (5):

$$I_{IN}(\theta) = \frac{1}{2} \frac{C}{I_C} \frac{V_{IN,pk}}{L} \sin\theta V_C \frac{T_{ON} + T_{FW}(\theta)}{T_{ON} + T_{FW}(\theta) + T_R} \qquad (7)$$

From Eq. (7) it emerges in particular that the input current is purely sinusoidal (thus guaranteeing an ideally unitary power factor and an ideally zero distortion) only in the case where the delay time interval $T_R$ is zero or substantially negligible.

However, it is known that there are several situations and applications in which, in order to maximize efficiency of the power converter, one can lengthen the delay time interval $T_R$, which thus may not be zero.

For example, so-called valley-skipping control techniques, of a known type, envisage that, in conditions of medium or low load, one or more of the valleys of the monitoring voltage $V_{ZCD}$ are skipped for the purposes of the control operations so as to limit the switching frequency.

On the basis of what has been discussed previously, however, the increase of the delay time interval $T_R$ entails an increase of the distortion characteristics (the so-called THD—Total Harmonic Distortion—factor) of the power converter, and in particular an increase in the harmonic current emission, which may not allow to achieve the expected performance (for example, a THD of less than 10% may be desired).

In other words, existing control solutions involve a compromise between the characteristics of distortion and the characteristics of efficiency that is possible to achieve, in particular in operating conditions of medium or low load.

BRIEF SUMMARY

One or more embodiments of the present disclosure solve the problems highlighted above and in particular provide a control solution that make it possible to combine the advantageous effects of the control techniques discussed previously, which instead envisage maximization of efficiency (by appropriate lengthening of the delay time interval $T_R$) or, alternatively, minimization of the harmonic current emission.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
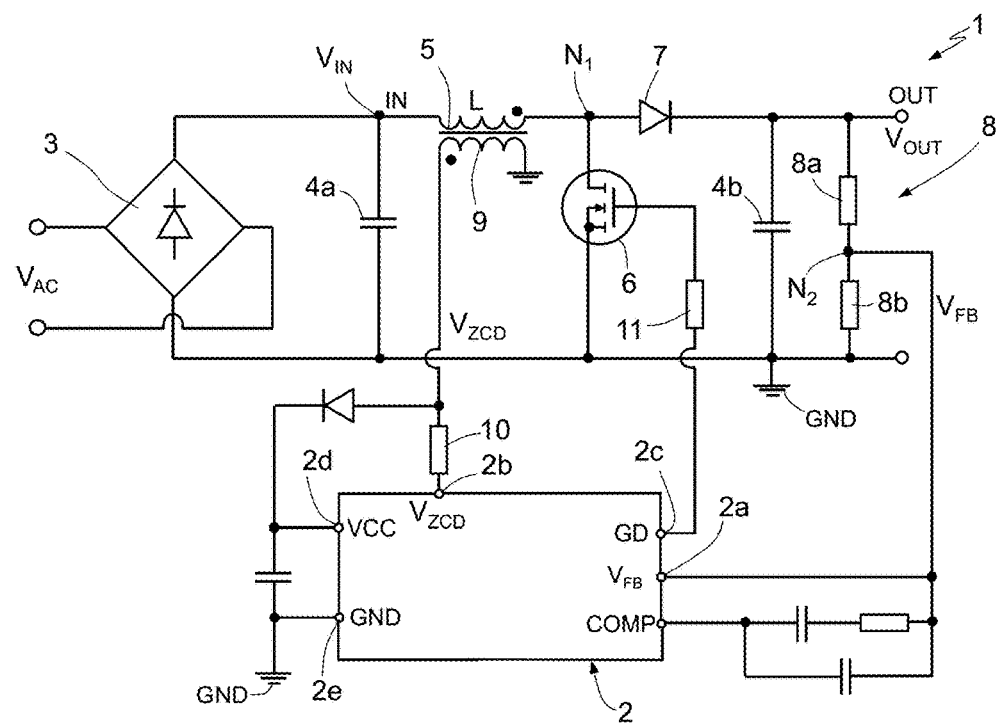
FIG. 1 shows a general circuit diagram of a power converter and of a corresponding control device, of a known type.
Figure 2:
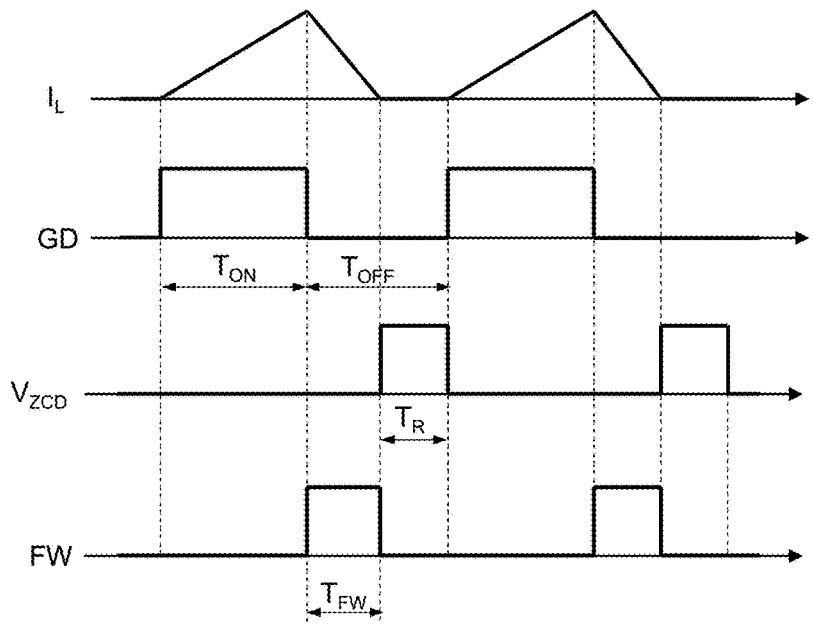
FIG. 2 shows diagrams of electrical quantities associated to the power converter of FIG. 1.

Considering that the switching period may be expressed as $T(\theta)=T_{ON}(\theta)+T_{FW}(\theta)+T_R$, and that the on time interval $T_{ON}(\theta)$ depends on the instantaneous mains phase angle $\theta$ (where $0 \leq \theta = 2\pi f_L t \leq \pi$, $f_L$ being the mains frequency), being in fact not necessarily constant as in traditional solutions, the aforesaid Eq. (7) may be rewritten as follows:

$$I_{IN}(\theta) = \frac{1}{2} \frac{C}{I_C} \frac{V_{IN,pk}}{L} \sin\theta V_C \frac{T(\theta) - T_R}{T(\theta)} \quad (8)$$

As will be discussed in detail, one aspect of the present solution stems from the realization, by the present Applicant, that, in the aforesaid Eq. (8) a distortion factor may be recognized, associated to the operation of averaging in the switching period and causing a distortion in the value of the input current $I_{IN}(\theta)$.

This distortion factor is given by the following expression:

$$\frac{T(\theta) - T_R}{T(\theta)} \quad (9)$$

and is thus linked to the switching operation and depends on the values of the time intervals $T_{ON}$, $T_{FW}$, and $T_R$. This distortion factor intervenes in the aforesaid Eq. (8) as a multiplying factor, depending on the phase angle $\theta$, thus distorting the plot, which would otherwise be sinusoidal, of the input current $I_{IN}$.

One aspect of the present solution consequently envisages an appropriate compensation of the aforesaid distortion by pre-distorting the value of the control voltage $V_C$ by a pre-distortion factor given by the inverse of the aforesaid distortion factor, i.e., given by:

$$\frac{T(\theta)}{T(\theta) - T_R} \quad (10)$$

This term, corresponding to the inverse of the distortion term introduced by the averaging operation described previously, thus enables the effects of distortion thereof to be substantially cancelled out, given that the control voltage $V_C$ intervenes in the aforesaid Eq. (8) as a multiplying factor of the input current $I_{IN}$.

The control method thus envisages generation of a pre-distorted control voltage $V_{CT}(\theta)$ starting from the control voltage $V_C$, given by the following expression:

$$V_{CT}(\theta) = K V_C \frac{T(\theta)}{T(\theta) - T_R} \quad (11)$$

where K is an appropriate constant, and $V_C$ is the control voltage originally provided in the control device 2 (in the case illustrated previously, the voltage present at the output of the error-amplifier stage 12) in order to determine the duration of the on interval $T_{ON}$.

Considering Eq. (8) and substituting therein the expression for the pre-distorted control voltage $V_{CT}(\theta)$, the following expression is obtained, once the distortion factor has been eliminated with the aforesaid pre-distortion factor, $$I_{IN}(\theta) = \frac{1}{2} \frac{C}{I_C} \frac{V_{IN,pk}}{L} K V_C \sin\theta \quad (12)$$

which is a perfect sinusoid, in particular independent of the duration of the delay time interval $T_R$ (and, equivalently of the on and free-wheeling intervals $T_{ON}$ and $T_{FW}$).

Figure 5:
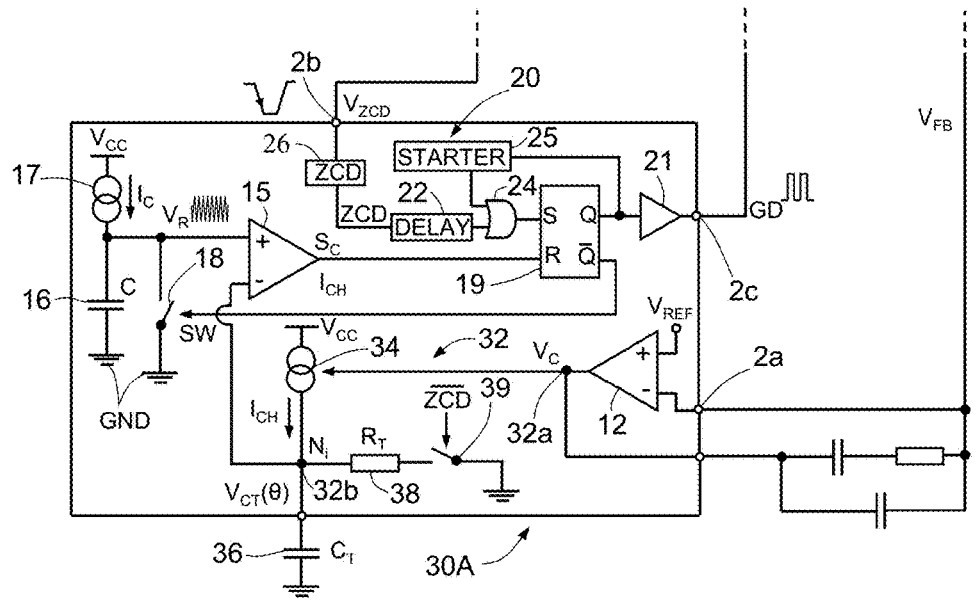
FIG. 5 shows a block diagram of a control device of a switching converter, for example of the type illustrated in FIG. 1, according to one embodiment of the present solution.

With reference to FIG. 5, a description of a possible embodiment of a control device 30A according to the present solution is now made. It should be noted that, in general, the control device 30A is realized in a way equivalent to the control device 2 described previously, and may also be used, for example, in a power converter 1, for instance a PFC converter of a voltage-boost type, having a configuration equivalent to the one discussed with reference to FIG. 1. It is, however, emphasized that what illustrated herein, as on the other hand highlighted also hereinafter, may find advantageous application also in other topologies of power converters and in different configurations of the corresponding control device.

As is shown in the aforesaid FIG. 5, the control device 30A differs from the control device 2 described previously owing to the presence of a pre-distortion stage 32, set between the output of the error-amplifier stage 12 and the inverting input of the comparator stage 15.

In particular, the pre-distortion stage 32 has an input 32a, which is connected to the output of the error-amplifier stage 12 and receives the control voltage $V_C$, and an output 32b, which supplies the pre-distorted control voltage $V_{CT}(\theta)$ to the inverting input terminal of the comparator stage 15.

The pre-distortion stage 32 comprises a controlled current generator 34, having a control input, which is coupled to the input 32a of the pre-distortion stage 32 and receives the control voltage $V_C$. This controlled current generator 34 generates at the output, on a charging node $N_i$, a charging current $I_{CH}$, the value of which is a function of the control voltage $V_c$, according to the expression:

$$I_{CH}(\theta) = G_M V_C \quad (13)$$

where $G_M$ is the voltage/current gain of the controlled current generator 34.

As illustrated, the controlled current generator 34 further has a supply input, which receives, for example, the supply voltage $V_{CC}$ of the power converter 1.

The pre-distortion stage 32 further comprises a charging capacitor 36, connected between the node $N_i$ and the reference terminal.

It should be noted that, depending on the applications, the charging capacitor 36 may be integrated with the other circuit elements of the control device 30A (being, that is, obtained within the same die and/or package); or else, the charging capacitor 36 may be a discrete component, electrically connected to an input terminal of the control device 30A. In the latter case, the charging node $N_i$ constitutes a further input terminal of the control device 30A.

The control device 30A further comprises:

a discharge resistor 38, connected to the charging node Ni and further, via a discharge switch 39, to the reference terminal.

The discharge switch 39 receives, as a control signal, the negated signal $\overline{ZCD}$, which constitutes the negated version of the detection signal ZCD generated by the detection unit 26, indicating onset of the zero-current condition in the inductor 5.

Figure 6:
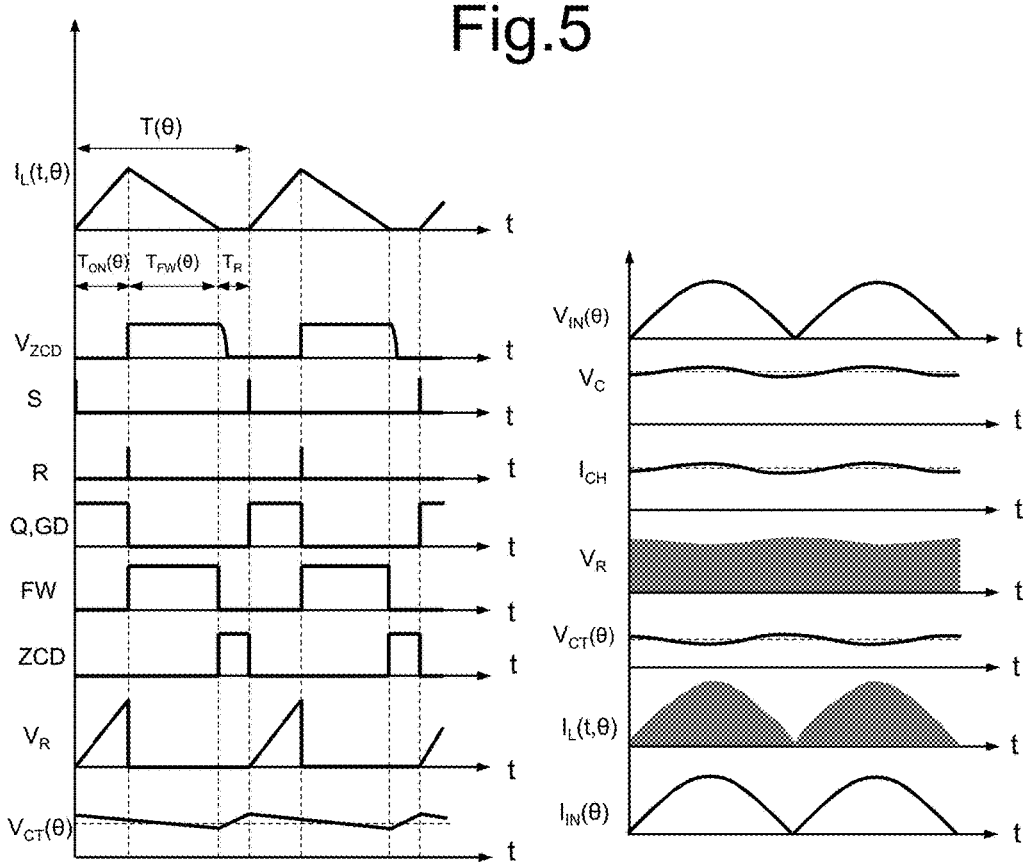
FIG. 6 shows diagrams of electrical quantities in the control device of FIG. 5.

In use, the discharge resistor 38 is connected in parallel to the charging capacitor 36, when the negated signal $\overline{ZCD}$ is high, i.e., during the time interval $T(\theta)-T_R$ in which the inductor 5 is magnetized (see also the subsequent FIG. 6), i.e., when the inductor current $I_L$ is non-zero.

The same discharge resistor 38 is, instead, disconnected and decoupled from the charging capacitor 36 when the negated signal $\overline{ZCD}$ is low, i.e., when the inductor 5 is demagnetized and the inductor current $I_L$ is zero.

Consequently, the charging capacitor 36 charges during the delay time interval $T_R$ in which the inductor 5 is demagnetized, whereas it discharges during the remaining time interval of the switching period $(T_{ON}(\theta)+T_{FW}(\theta))$, in which the inductor 5 is magnetized by the inductor current $I_L$.

In other words, discharge of the charging capacitor 36 occurs during the time interval, in the switching period T, in which the inductor current $I_L$ is non-zero.

The voltage across the charging capacitor 36 is the pre-distorted control voltage $V_{CT}(\theta)$ that is supplied to the inverting input terminal of the comparator stage 15 (it should be noted that no modification is, instead, made to the circuit components connected to the non-inverting terminal of the same comparator stage 15).

On the hypothesis that the control voltage $V_C$ is substantially constant during a mains half-period (as discussed previously), also the charging current $I_{CH}(\theta)$ is substantially constant.

In particular, for the following considerations, it is assumed that the following expression applies:

$$T(\theta) \ll R_T C_T \ll 1/f_L \quad (14)$$

where $f_L$ is the mains frequency; i.e., it is assumed that the switching period is much lower than the time constant $R_T C_T$ defined by the discharge resistor 38 and the charging capacitor 36, and that the same time constant $R_T C_T$ is much lower than the mains period. If this assumption is valid, the ripple of the switching frequency on the charging capacitor 36 is negligible. Further, the charging current $I_{CH}(\theta)$ is substantially constant during each mains half-period.

Applying the charge-balance relation on the charging capacitor 36 (considering that the charging current $I_{CH}$ flows towards the charging capacitor 36 throughout the period $T(\theta)$ and that discharge towards the reference terminal occurs during the interval $T(\theta)-T_R$), the following expression may be obtained:

$$I_{CH}(\theta)T(\theta) = \frac{V_{CT}(\theta)}{R_T}[T(\theta) - T_R] \quad (15)$$

Substituting in Eq. (15), Eq. (13) for the charging current $I_{CH}(\theta)$, and solving with respect to the pre-distorted control voltage $V_{CT}(\theta)$, the following expression is obtained:

$$V_{CT}(\theta) = G_M R_T V_C \frac{T(\theta)}{T(\theta) - T_R} \quad (16)$$

which has the same form as Eq. (11), and thus satisfies the control target, with the constant K given by:

$$K = G_M R_T \quad (17)$$

It may thus be concluded that the solution proposed makes it possible to obtain an input current $I_{IN}$ that is always sinusoidal, in particular even in the case where the delay time interval $T_R$ is non-zero.

As mentioned previously, in the solution proposed, the on interval $T_{ON}$ is not constant, as in traditional solutions, but depends upon the instantaneous mains phase $\theta$, according to the expression $$T_{ON}(\theta) = \frac{C}{I_C} G_M R_T V_C \frac{T(\theta)}{T(\theta) - T_R} \quad (18)$$

Figure 4:
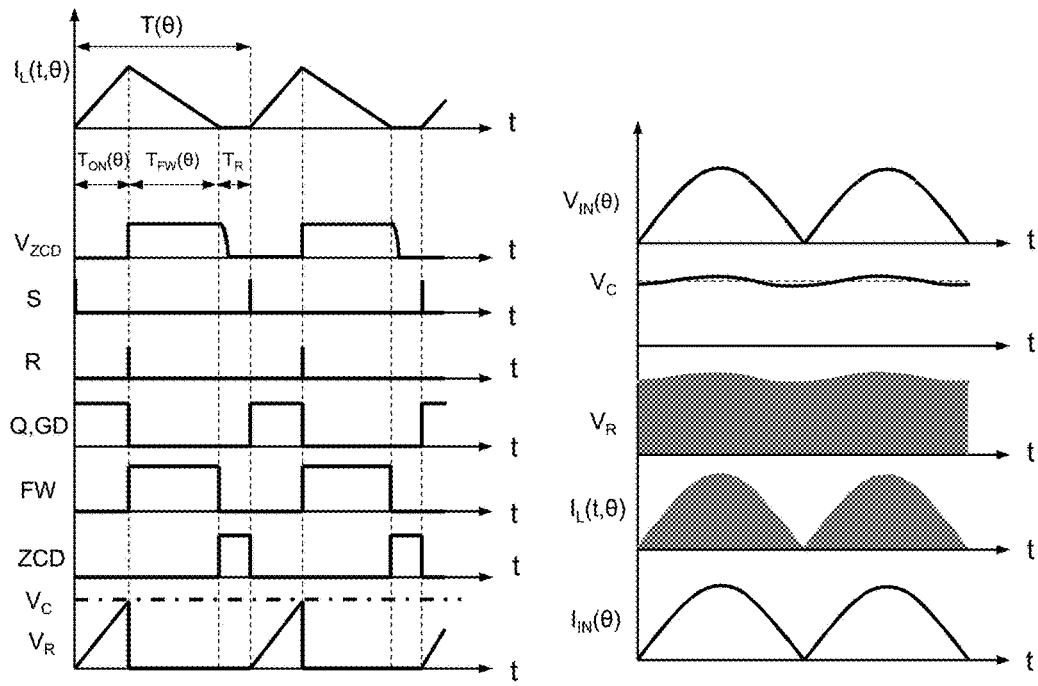
FIG. 4 shows diagrams of electrical quantities in the control device of FIG. 3.

In a way similar to what has been shown previously in FIG. 4, FIG. 6 shows the main electrical quantities in the control device 30A, the plot of which reflects what has been illustrated previously.

Figure 7:
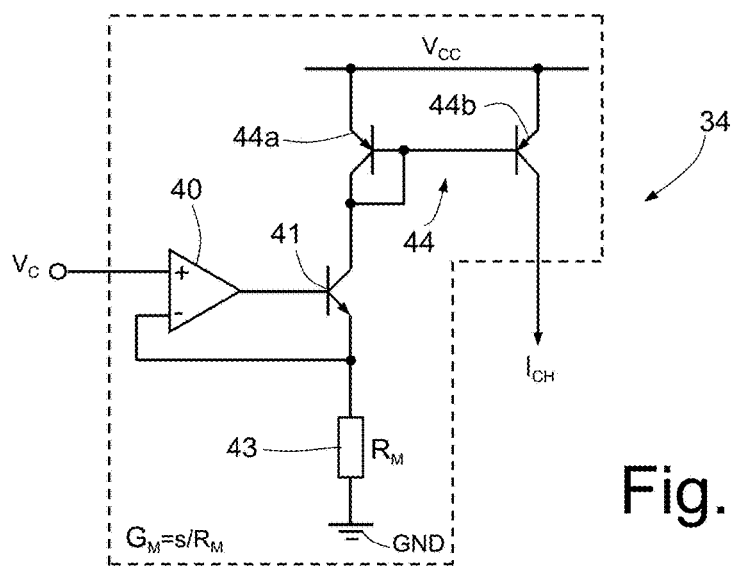
FIG. 7 is a circuit diagram of a current generator in the control device of FIG. 5.

With reference to FIG. 7, a possible circuit embodiment of the controlled current generator 34 is now discussed, in this case comprising an operational amplifier 40, having its non-inverting terminal that is connected to the control input of the controlled current generator 34 and receives the control voltage $V_C$, its output terminal connected to the base terminal of a transistor 41, and its inverting terminal connected to the emitter terminal of the same transistor 41.

The controlled current generator 34 further comprises: a resistor 43, connected between the aforesaid emitter terminal of the transistor 41 and the reference terminal; and a current mirror 44, constituted, in a per se known manner (not described in detail herein), by a pair of transistors 44a, 44b.

In particular, a first branch of the current mirror 44 is connected to the collector terminal of the transistor 41, whereas a second branch of the current mirror 44 is connected to the output of the controlled current generator 34, to supply the charging current $I_{CH}$.

It may be immediately verified that, in this solution, the charging current $I_{CH}$ is given by the following expression:

$$I_{CH} = s \frac{V_C}{R_M} \quad (19)$$

where $R_M$ is the resistance of resistor 43, and s is the mirroring factor of the current mirror 44.

It follows that the aforesaid voltage/current gain $G_M$ is in this case given by $$G_M = \frac{s}{R_M} \quad (20)$$

The present Applicant has tested and validated the solution proposed by several simulations and experimental tests.

Figure 3:
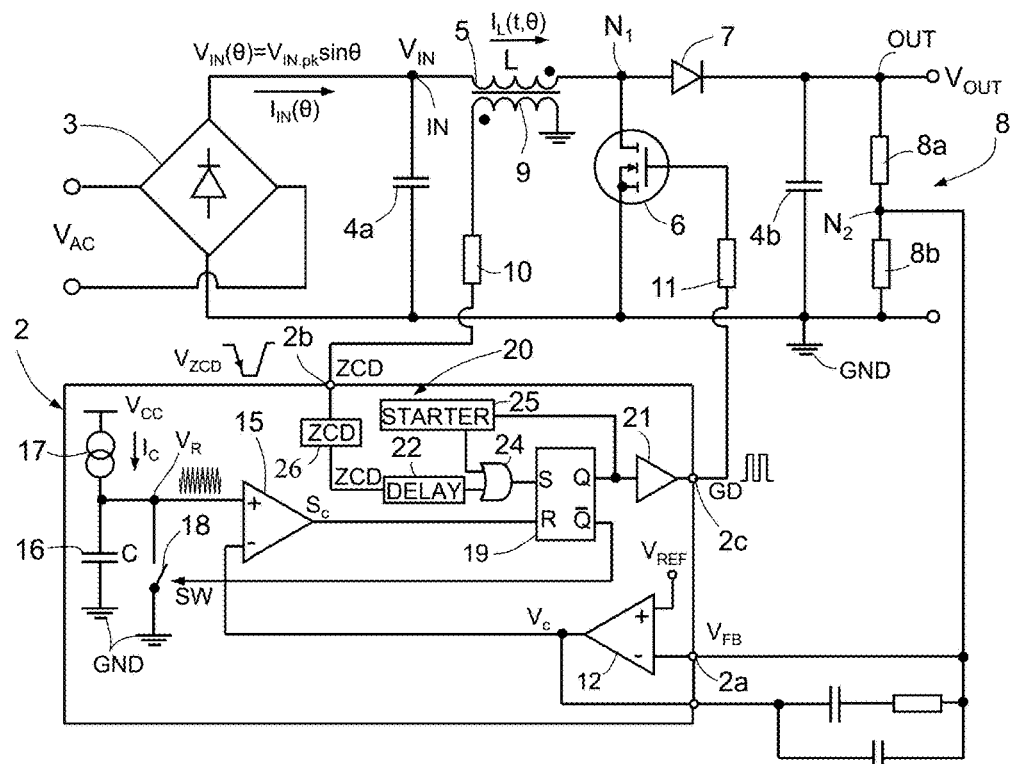
FIG. 3 shows a more detailed block diagram of a control device of the power converter of FIG. 1.
Figure 8:
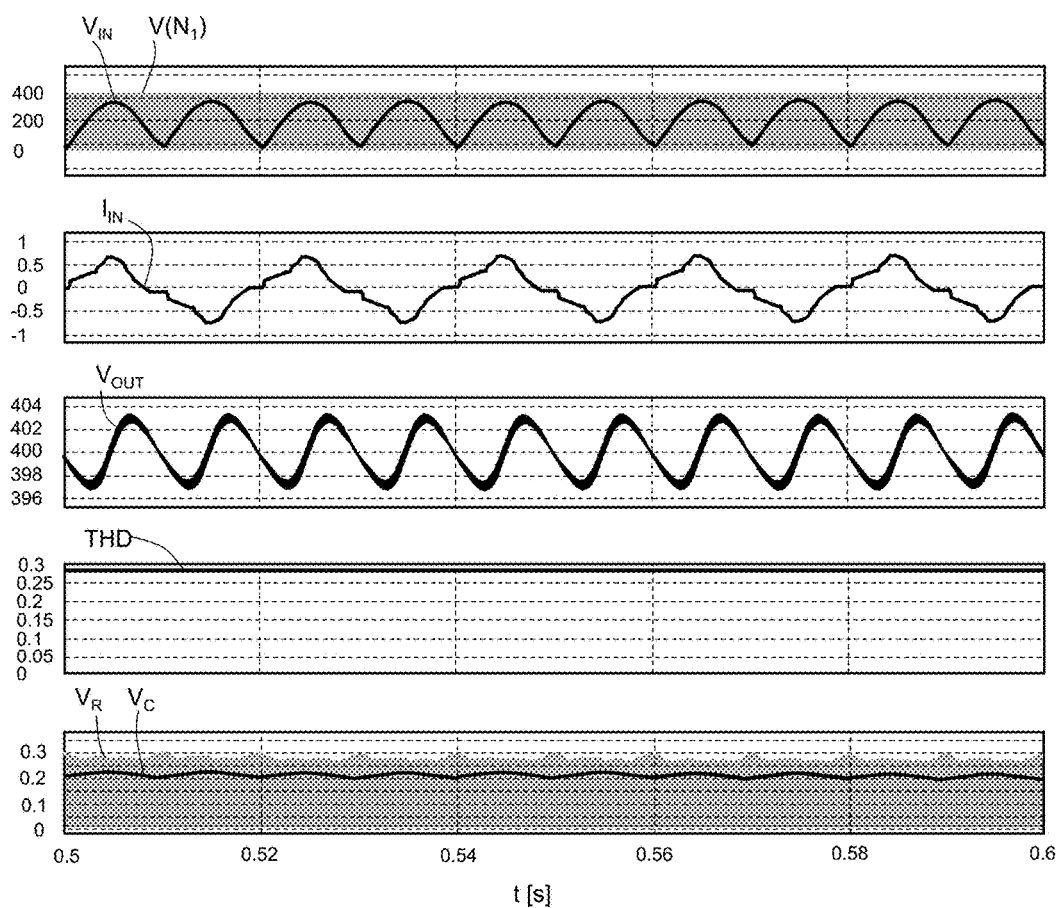
FIGS. 8 and 9 show plots of electrical quantities of the control device of FIG. 3 and of FIG. 5, respectively.
Figure 9:
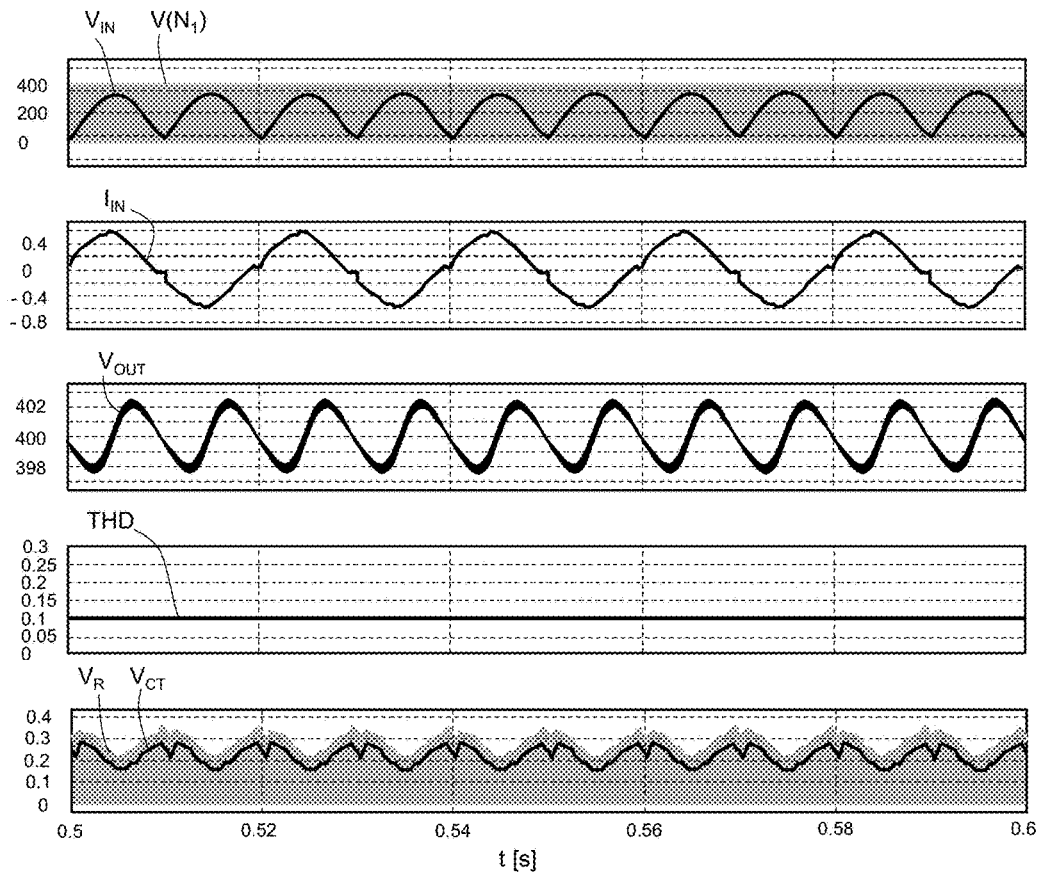

By way of example, FIGS. 8 and 9 provide a comparison between the performance of a control device according to the known art (in particular, the control device 2 of FIG. 3), shown in FIG. 8, and the performance of the control device 30 according to the present solution, shown in FIG. 9.

In both cases, the power converter operates at half load, and the valley-skipping mode is enabled in order to increase efficiency.

It may be immediately verified that the solution proposed enables drastic reduction of the waveform distortion, obtaining a substantial reduction of the distortion factor THD, from approximately 29% (in the traditional solution) to approximately 10% (in the proposed solution).

Figure 10:
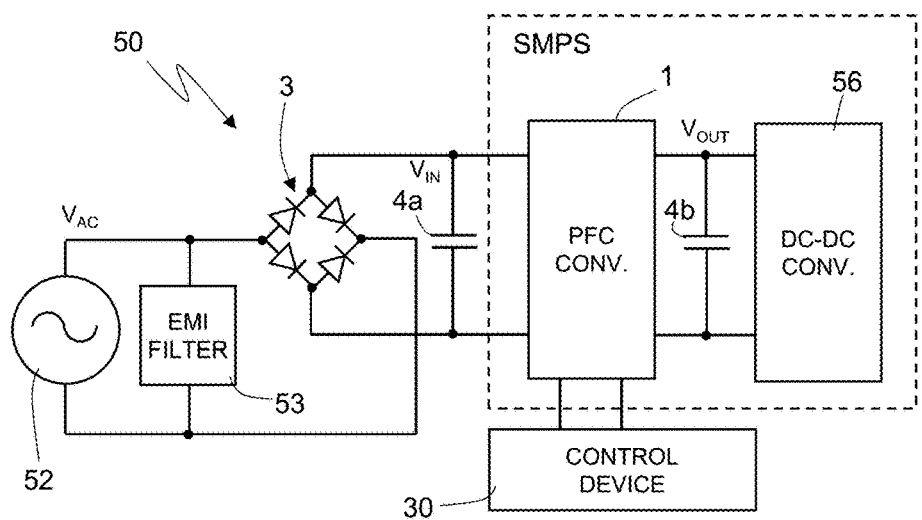
FIG. 10 is a general block diagram of an electronic device that uses a power converter.

As mentioned previously, the power converter 1 and the corresponding control device 30A may advantageously be used in a switching power supply 50, as illustrated in FIG. 10.

In particular, the switching power supply 50 comprises the rectifier stage 3 (for example, of the diode-bridge type), connected to the electrical mains supply 52, in the example via an EMI filter 53, and the input capacitor element 4a, connected to the output of the rectifier stage 3, on which the input voltage $V_{IN}$ is present.

The switching power supply 50 further comprises the power converter 1, having its input terminal IN connected to the input capacitor element 4a and its output terminal OUT connected to the charge-storage element 4b, as previously defined.

The control device 30A controls operation of the power converter 1 for ensuring a desired power factor in the absorption from the electrical mains supply 52.

The switching power supply 50 further comprises an output power converter 56, in the example of a DC/DC type, having its input connected to the output capacitor element 4b and designed to supply to a load or final user (not illustrated) a desired value of output voltage, for example with a value that is appropriately reduced with respect to the value of the output voltage $V_{OUT}$.

The advantages of the solution proposed emerge clearly from the foregoing description.

In any case, it is once again emphasized that the present solution allows to overcome the limits of control solutions of a known type, making it possible to obtain, among other features, an ideally sinusoidal input current $I_{IN}$ and in any case a distortion factor of less than 10%.

At the same time, the control solution proposed enables use, without any repercussions, of control techniques aimed at maximizing the efficiency in any load condition (such as the valley-skipping techniques, or in general techniques that envisage an appropriate duration, even lengthened, of the delay time interval $T_R$).

Finally, it is clear that modifications and variations may be made to what has been described and illustrated herein, without thereby departing from the scope of the present disclosure.

In particular, it is once again emphasized that, even though in the foregoing description explicit reference has been made to a converter of a boost type, the present solution may advantageously be applied also to other topologies of converters, not only for power-factor-control applications.

Figure 11:
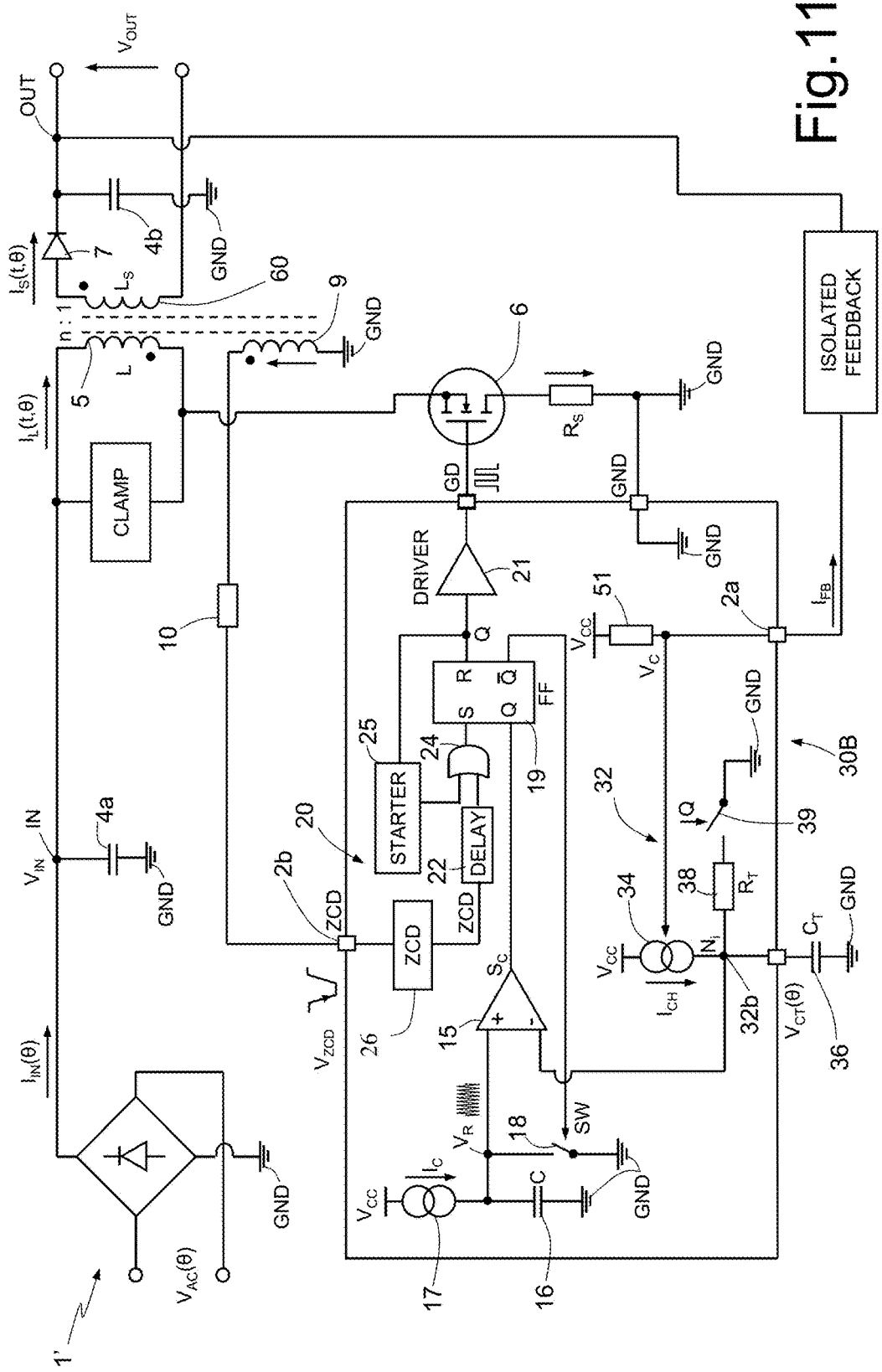
FIG. 11 shows a circuit diagram of a power converter and of a corresponding control device, according to a further embodiment of the present solution.

In this regard, FIG. 11 shows the application of the solution proposed to a power converter, designated by 1', of a flyback type.

In order not to burden the present discussion, the circuit configuration of the power converter 1', which is of a known type, is not described in detail, but it is only highlighted that the solution previously described finds similar application also in this power converter 1', with some differences due to the different circuit topology thereof.

In particular, in this case, the primary winding of the transformer of the flyback converter corresponds to the inductor 5 of the boost converter (and for this reason is designated by the same reference number); the inductor current $I_L$ flows in this case through the inductor element constituted by this primary winding.

The control voltage $V_C$ is in this case obtained starting from a feedback current $I_{FB}$, which is drawn from an insulated secondary winding 60 of the transformer of the power converter 1'. This feedback current $I_{FB}$ generates, in a control resistor 51, connected between the supply terminal and the first input terminal 2a of the control device 30B, the control voltage $V_C$.

In a way altogether similar to what has been described previously, the control voltage $V_C$ is pre-distorted by the pre-distortion stage 32 to generate the pre-distorted control voltage $V_{CT}(\theta)$. The pre-distortion stage 32 is obtained in a way altogether similar to what has been discussed previously, with the only difference that the discharge switch 39 is controlled in this case by the signal Q of the S/R flip-flop 19.

In fact, in this case, as will be evident to a person skilled in the field, the distortion factor associated to the averaging operation of the inductor current $I_L$ during the switching period, is given by:

$$\frac{T_{ON}(\theta)}{T(\theta)} \tag{21}$$

It should be noted that in this case this distortion factor is linked, to the duration of the first time interval $T_{ON}$ with respect to the switching period $T(\theta)$. In fact, also assuming a negligible delay time interval TR, the distortion factor is not zero ($T_{ON}/T$).

The discharge switch 39 is in this case closed when the signal Q is high (and the control signal GD is also high), i.e., during the on interval $T_{ON}$, whereas it is off when the signal Q is low (and the control signal GD is also low), i.e., during the off interval $T_{OFF}$ of the switching period $T(\theta)$.

Also in this case, the discharge of the charging capacitor 36 occurs during the time interval, in the switching period T, during which the current $I_L$ is non-zero (with the current $I_L$ that flows, in this case, through the inductor element 5 constituted by the primary winding of the transformer).

It follows that, in this embodiment, the pre-distortion factor by which the control voltage $V_C$ in the pre-distortion stage 32 is multiplied is given by:

$$\frac{T(\theta)}{T_{ON}(\theta)} \tag{22}$$

Figure 12:
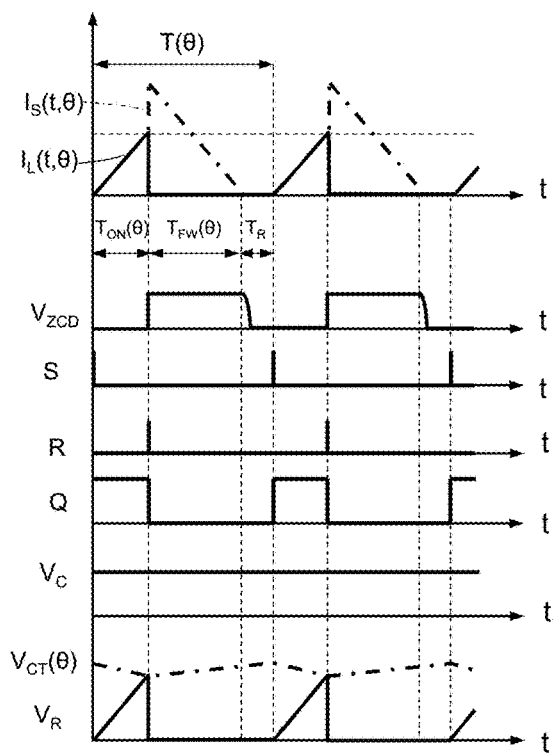
FIG. 12 shows diagrams of electrical quantities in the power converter of FIG. 11.

For completeness, hereinafter all the significant equations relating to this further embodiment are in any case provided. Moreover, in a way similar to what has been discussed previously, FIG. 12 shows the main electrical quantities in the power converter 1'.

Applying, as discussed previously, considerations of charge balance with respect to the charging capacitor 36 of the pre-distortion stage 32:

$$I_{CH}(\theta)T(\theta) = \frac{V_{CT}(\theta)}{R_T}T_{ON}(\theta) \tag{23}$$

Considering that also in this case the aforesaid Eq. (13) is valid, the following expression is obtained:

$$V_{CT}(\theta) = G_M R_T V_C \frac{T(\theta)}{T_{ON}(\theta)} \quad (24)$$

Moreover, considering that $V_{R\_pk} = V_{CT}(\theta)$ for the comparator stage 15 and also Eq. (2) discussed previously, it is obtained:

$$T_{ON}(\theta) = G_M R_T \frac{C}{I} V_C \frac{T(\theta)}{T_{ON}(\theta)} \quad (25)$$

Substituting the aforesaid Eq. (25) in Eq. (3), the peak value of the inductor current is given by:

$$I_{L\_pk}(\theta) = \frac{V_{IN}(\theta)}{L} G_M R_T \frac{C}{I} V_C \frac{T(\theta)}{T_{ON}(\theta)} \quad (26)$$

The input current of the power converter, obtained by averaging the inductor current $I_L(t,\theta)$ over a switching period, is in this case given by:

$$I_{IN}(\theta) = \frac{1}{2} I_{L\_pk}(\theta) \frac{T_{ON}(\theta)}{T(\theta)} \quad (27)$$

Substituting Eq. (26) and considering that the expression $V_{IN}(\theta) = V_{IN\_pk} |\sin \theta|$ is once again valid:

$$I_{in}(\theta) = \frac{G_M R_T}{2L} \frac{C}{I} V_C V_{in,pk} \sin\theta \quad (28)$$

As desired, this current is sinusoidal in all conditions, irrespective, in particular, of the duration of the delay time interval $T_R$.

Even though it will not be discussed in detail, it will at this point be evident how the solution discussed may find advantageous applications also in further topologies of power converters, for example of the buck-boost, SEPIC, Ćuk, zeta (inverse SEPIC) type and corresponding variants, for example in all converters that have a conversion, or gain, factor between the input and the output of the type:

$$M(D) = \frac{D}{1-D}$$

where D is the duty cycle of the switching period, i.e., the ratio between the on interval $T_{ON}$ and the switching period T.

A further possible variant of the present solution is now described, once again with reference, by way of example, to the application for a power converter of a voltage-boost type.

Figure 13:
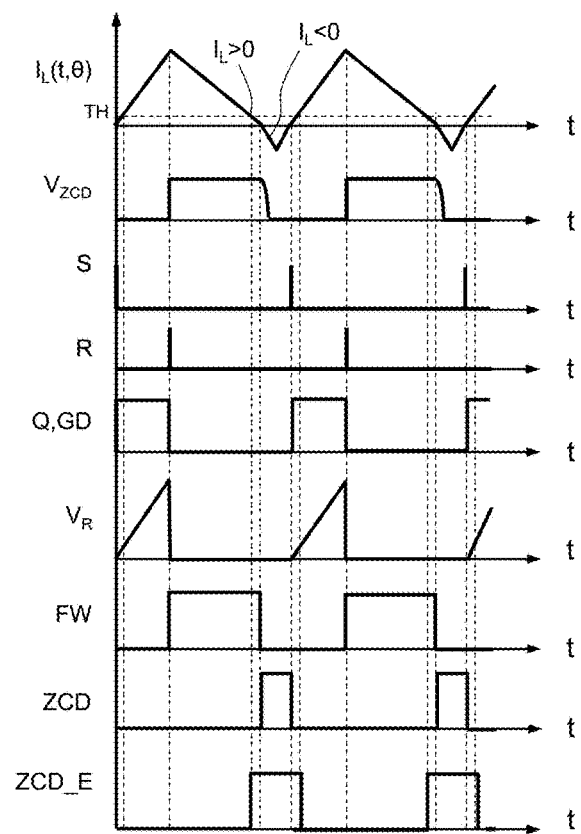
FIG. 13 shows diagrams of electrical quantities corresponding to yet a further embodiment of the present solution.

As illustrated in the plots of FIG. 13, and as on the other hand will be known to a person skilled in the field, on account of the parasitic capacitance at the drain terminal of the MOSFET that implements the switch element of the power converter, it may happen that the inductor current $I_L$ becomes negative. Consequently, it may happen that the peak value $I_{L\_pk}$ of the inductor current $I_L$ is lower than the expected value.

Known control solutions envisage, to compensate this effect, appropriate increase of the duration of the on interval $T_{ON}$, for example, by appropriately delaying the start of the ramp of the ramp voltage $V_R$, which starts as soon as the inductor current $I_L$ becomes positive (instead of being thus synchronized with the control signal GD).

Figure 14:
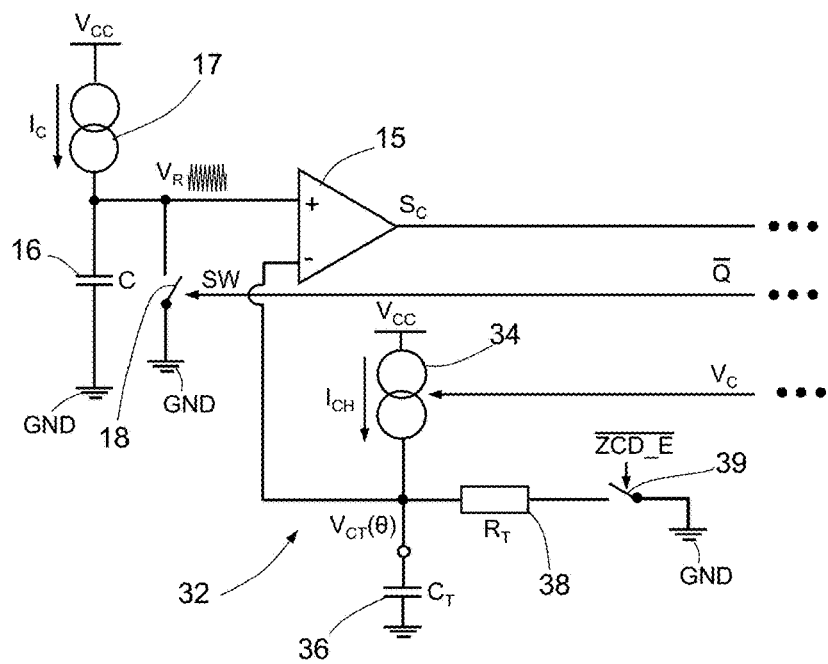
FIG. 14 shows a circuit diagram of a control device of a power converter, according to the aforesaid further embodiment of the present solution.

As an alternative to this known technique, the present solution may achieve the desired effect of lengthening the duration of the on interval $T_{ON}$, by appropriate driving the discharge switch 39 of the pre-distortion stage 32 via a modified version of the negated signal $\overline{ZCD}$, as shown in FIG. 14.

In particular, the discharge switch 39 is in this case driven by a modified driving signal $\overline{ZCD}$, having a duration appropriately lengthened with respect to the negated signal $\overline{ZCD}$.

Figure 15:
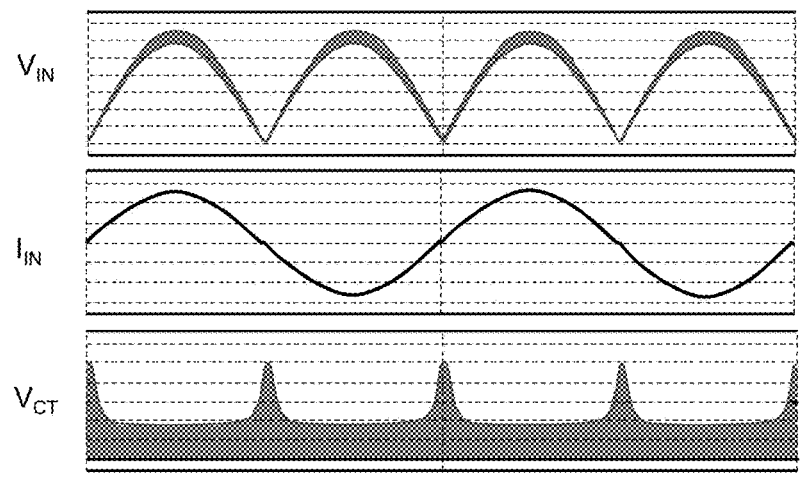
FIG. 15 shows plots of electrical quantities in the control device of FIG. 14.

As shown in the plots of the aforesaid FIG. 13 and also of FIG. 15, the duration of the modified driving signal is appropriately lengthened with respect to the negated signal $\overline{ZCD}$, in this way making it possible to obtain an increase of the pre-distorted control voltage $V_{CT}$ and, thus, a desired increase of the on interval $T_{ON}$.

In this example, the modified driving signal $\overline{ZCD\_E}$ may be obtained by comparing the inductor current with a positive threshold TH; in particular, the modified driving signal $\overline{ZCD\_E}$ switches upon crossing of the threshold TH by the inductor current $I_L$.

Finally, it is emphasized that the power converter could be supplied also by a power-supply source different from the electrical mains supply. Also, the converter according to the present solution may advantageously provide a voltage regulator or converter, to which the foregoing treatment has made explicitly reference, by way of non-limiting example, or a current regulator or converter (for example, in driver devices for LEDs or in battery chargers).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A control device, for controlling a switching converter, comprising:
    a switch controller configured to generate a control signal having a switching period for controlling switching of a switch element of the switching converter, said switching period including a first time interval in which the control signal causes the switch element to cause an inductor current to flow in an inductor element of the switching converter, a second time interval in which the control signal causes the switch element to cause energy to be transferred from the inductor element, and a third time interval, which is a wait interval, that extends from a zero level of the inductor current to a next turn on of the switch element; and
    a pre-distortion stage configured to receive a control voltage, indicative of an output voltage of the switching converter, and generate a pre-distorted control voltage that is positively correlated with both the control voltage and the third time interval and negatively correlated with the first time interval, wherein the switch controller is configured to control a duration of said first time interval to be positively correlated with the pre-distorted control voltage.

2. The device according to claim 1, wherein said pre-distortion stage comprises a charging capacitor and a discharge switch configured to be controlled by a timing signal, said discharge switch being configured to control discharge of said charging capacitor during a time interval, in said switching period, during which the inductor current is non-zero.

3. The device according to claim 2, wherein said pre-distortion stage is configured to control charging of said charging capacitor as a function of said control voltage and provide said pre-distorted control voltage as a voltage across said charging capacitor.

4. The device according to claim 2, wherein said pre-distortion stage comprises a current generator configured to receive the control voltage and generate, on a charging node coupled to said charging capacitor, a charging current which is a function of the control voltage.

5. The device according to claim 4, wherein said pre-distortion stage further comprises a discharge resistor, which is connected to the charging node and said discharge switch and defines a time constant with said charging capacitor.

6. The device according to claim 2, wherein the switch controller includes:
a comparator stage, having a first comparison terminal configured to receive said pre-distorted control voltage, a second comparison terminal configured to receive a ramp voltage, and an output configured to provide a comparison signal based on the ramp voltage and the pre-distorted control voltage; and
an S/R flip-flop, having a reset input that is connected to the output of the comparator stage, and an output configured to supply said control signal based on the comparison signal.

7. The device according to claim 6, further comprising:
an input terminal configured to receive a monitoring voltage from an auxiliary winding magnetically coupled to said inductor element;
a detection unit coupled to said input terminal and configured to generate a detection signal indicating onset of a zero-current condition in said inductor element; and
a delay unit electrically coupled to an output of the detection unit and configured to apply a time delay having a duration equal to said third time interval; wherein said S/R flip-flop has a set input coupled to an output of said delay unit.

8. The device according to claim 7, wherein the detection unit is configured to control said discharge switch with a negated version of said detection signal as the timing signal.

9. The device according to claim 7, wherein the S/R flip-flop is configured to produce the timing signal, for controlling said discharge switch, at the output of said S/R flip-flop.

10. The device according to claim 1, further comprising:
an input terminal configured to receive a feedback voltage generated as a function of the output voltage, and
an error-amplifier stage having a first input that is connected to said input terminal and is configured to receive the feedback voltage, a second input configured to receive a reference voltage, and an output configured to supply, as a function of a difference between the feedback voltage and the reference voltage, said control voltage.

11. The switching converter according to claim 1, wherein the pre-distortion stage comprises a charging capacitor and a discharge switch configured to be controlled by a timing signal, the discharge switch being configured to control discharge of the charging capacitor during a time interval, in the switching period, during which the inductor current is non-zero.

12. A switching converter, comprising an inductor element;
a switch element electrically coupled to the inductor element;
control device including:
a switch controller configured to generate a control signal having a
switching period for controlling switching of the switch element, said switching period including a first time interval in which the control signal causes the switch element to cause an inductor current to flow in the inductor element, a second time interval in which the control signal causes the switch element to cause energy to be transferred from the inductor element, and a third time interval, which is a wait interval, that extends from a zero level of the inductor current to a next turn on of the switch element; and
a pre-distortion stage configured to receive a control voltage, indicative of an output voltage of the switching converter, and generate a pre-distorted control voltage that is positively correlated with both the control voltage and the third time interval and negatively correlated with the first time interval, wherein the switch controller is configured to control a duration of said first time interval to be positively correlated with the pre-distorted control voltage.

13. An electrical apparatus comprising:
a switching converter that includes an inductor element, a switch element electrically coupled to the inductor element, and an output electrically coupled to the inductor element;
an output stage having an input electrically coupled to the output of the switching converter and configured to supply a regulated quantity to a load; and
a control device configured to control the switching converter, the control device including:
a switch controller configured to generate a control signal having a switching period for controlling switching of the switch element, said switching period including a first time interval in which the control signal causes the switch element to cause an inductor current to flow in the inductor element, a second time interval in which the control signal causes the switch element to cause energy to be transferred from the inductor element, and a third, wait, time interval, which is a wait interval, that extends from a zero level of the inductor current to a next turn on of the switch element; and
a pre-distortion stage configured to receive a control voltage, indicative of an output voltage of the switching converter, and generate a pre-distorted control voltage that is positively correlated with both the control voltage and a the third time interval and negatively correlated with the first time interval, wherein the switch controller is configured to control a duration of said first time interval to be positively correlated with the pre-distorted control voltage.

14. The apparatus according to claim 13, comprising an input stage, including said converter, configured to be coupled to a power-supply source and to supply an input quantity, wherein said control device is configured to control a power correction factor in an absorption of power from said power-supply source.

15. A control method, comprising:
generating a control signal having a switching period for controlling switching of a switch element of a switching converter, said switching period including a first time interval in which an inductor current flows in a inductor element of the switching converter for storage of energy, a second time interval where energy is transferred onto a storage element through a diode element, and a third time interval, which is a wait interval, that extends from a zero level of the inductor current to a next turn on of the switch element;
receiving a control voltage indicative of an output voltage of the switching converter;
producing a pre-distorted control voltage by applying to said control voltage a pre-distortion by a pre-distortion factor that is positively correlated with both the control voltage and the third time interval and negatively correlated with the first time interval; and
controlling a duration of the first time interval to be positively correlated with the pre-distortion control voltage.

16. The method according to claim 15, wherein said pre-distortion factor is given by a ratio between said switching period and said switching period minus the third time interval.

17. The method according to claim 15, said pre-distortion factor is given by a ratio between said switching period and said first time interval.

18. The method according to claim 15, wherein applying the pre distortion to control voltage includes carrying out discharge of a charging capacitor with a discharge current, which is a function of said control voltage, during a time interval, in said switching period, in which an inductor current, in said inductor element, is non-zero; a voltage across said charging capacitor being said pre-distorted control voltage.

19. The method according to claim 15, wherein controlling the duration of the first time interval includes:
comparing said pre-distorted control voltage with a ramp voltageand generating a comparison signal based on the comparing; and
setting a first boundary of said first time interval upon switching of said comparison signal.

20. The method according to claim 19, wherein said converter comprises an auxiliary winding magnetically coupled to said inductor element and controlling the duration of the first time interval includes:
generating a detection signal indicating onset of a zero-current condition in said inductor element as a function of a monitoring voltage on the auxiliary winding; and
setting a second boundary of said first time interval by applying a time delay, having a duration equal to said third time interval, to said detection signal.

* * * * *